United States Patent [19]

Roscoe et al.

[11] Patent Number: 5,978,233
[45] Date of Patent: Nov. 2, 1999

[54] SWELL-LATCH PRINTED CIRCUIT BOARD LATCHING AND EJECTING MECHANISM

[76] Inventors: Brett D. Roscoe, 9717 Cypresswood Dr. #103, Houston, Tex. 77070; George D. Megason, 8403 Shadow Valley Ct., Spring, Tex. 77379; Joseph R. Allen, 16010 Lakestone Dr., Tomball, Tex. 77375

[21] Appl. No.: 09/099,585

[22] Filed: Jun. 18, 1998

[51] Int. Cl.$^6$ .............................. H05K 7/14; B65D 85/86
[52] U.S. Cl. .................... 361/796; 361/754; 361/759; 361/801; 211/41.17; 206/706
[58] Field of Search .................... 361/683, 685, 361/724, 726, 752, 754, 759, 796, 801, 802; 211/41.17; 206/706; 248/560; 439/928.1

[56] References Cited

U.S. PATENT DOCUMENTS 5,673,172  9/1997  Hastings et al. ........................ 361/685
5,828,546 10/1998  Tirrell et al. ............................ 361/685

OTHER PUBLICATIONS

Southco, Inc. Catalog No. 48 NA (pp. J–2–J–5), date unknown.

Primary Examiner—Leo P. Picard
Assistant Examiner—Jayprakash N. Gandhi
Attorney, Agent, or Firm—Williams, Morgan & Amerson, P.C.

[57] ABSTRACT

An apparatus is provided for coupling a printed circuit board within a printed circuit board cage. The apparatus includes a baseplate and a latch. The baseplate is mounted to the printed circuit board. The latch is rotably coupled to the baseplate. The latch includes a pivoting portion, a shaft, and a swell nut. The pivoting portion includes an ejector extending from an end of the pivoting portion. The ejector is engageable with the printed circuit board cage. The shaft is coupled to the pivoting portion. The swell nut is coupled to the shaft and engageable with the printed circuit board cage.

24 Claims, 6 Drawing Sheets

SWELL-LATCH PRINTED CIRCUIT BOARD LATCHING AND EJECTING MECHANISM

BACKGROUND OF THE INVENTION

1. Field of the Invention

This invention relates generally to a mechanism for mounting a printed circuit board, and, more particularly, to a mechanism for latching a printed circuit board into an electrical connector and ejecting the printed circuit board from the electrical connector.

2. Description of the Related Art

In the field of electronics, designers have been continuously reducing the size of components, such as semiconductor chips, to increase the speed and performance of the electronic circuits, and to more efficiently utilize semiconductor real estate. Typically, these semiconductor chips are mounted on a printed circuit board, which is, in turn, coupled to other printed circuit boards through various electrical connectors to form an electrical system, such as a personal computer.

As the semiconductor chips have become smaller, and electrical systems have become more complex, more chips are located on a printed circuit board. As more and more semiconductor chips and electronic circuits are packed onto a printed circuit board, more and more electrical signals are generated and delivered throughout the system, especially to the other printed circuit boards. Commonly, these signals are delivered "off-board" to the other printed circuit boards via an edge connector. That is, a series of metallic tabs are formed along at least one edge of the printed circuit board, and metallic traces interconnect the semiconductor chips with the metallic tabs. The metallic tabs are arranged to coincide with spring loaded metallic tabs or contacts in an edge connector. The edge connector is interconnected with other edge connectors and printed circuit boards so that the electrical signals can be transmitted therebetween.

In systems where the edge connector area cannot be increased in proportion to the number of signals, the individual metallic tabs are necessarily reduced in width to accommodate more metallic tabs. For example, state-of-the-art microprocessor printed circuit boards have over 300 metallic tabs that measure 50 thousandths of an inch wide. The tabs are arranged in a tiered configuration with three tabs every 100 thousandths of an inch. These densely packed contacts can become misaligned with their corresponding edge connector by a relatively minor displacement of only 20 thousandths of an inch. That is, the printed circuit board can become uncoupled or disconnected from its corresponding electrical connector relatively easily. Disconnection, of course, prevents the electrical signals from being properly delivered to other printed circuit boards in the electrical system, which prevents proper operation of the system. Moreover, this relatively minor displacement is difficult to visually detect, and, thus, faulty operation is difficult to diagnose.

The large size and relatively heavy weight of current microprocessor printed circuit boards further exacerbates the alignment problem because of the board's own inertia during minor g-force shocks. That is, even a minor bumping of the electrical system may be enough to cause the printed circuit board to shift and cease proper operation.

Further, the increasing complexity of electrical systems has also resulted in more printed circuit boards being packed into the same or smaller space. Thus, less and less room is available for the electrical system, which necessitates that the boards be closely proximate one another. This close positioning of the printed circuit boards reduces the available envelope for mechanisms useful in fixing the printed circuit boards against longitudinal movement. Accordingly, bulky latching and ejecting mechanisms are not useful in compact, densely packed electrical systems.

Additionally, maintaining and upgrading electrical systems commonly requires that the printed circuit boards be readily accessible, easy to remove, and easy to install. Moreover, it is a significant disadvantage if special tools are required to access, remove, or install the printed circuit boards. Rather, it is highly advantageous if a user of the electrical system can replace a printed circuit board without the use of any special tools.

The present invention is directed to overcoming, or at least reducing the effects of, one or more of the problems set forth above.

SUMMARY OF THE INVENTION

In one aspect of the present invention, an apparatus is provided for coupling a printed circuit board within a printed circuit board cage. The apparatus includes a baseplate and a latch. The baseplate is mounted to the printed circuit board. The latch is rotably coupled to the baseplate. The latch includes a pivoting portion, a shaft, and a swell nut. The pivoting portion includes an ejector extending from an end of the pivoting portion. The ejector is engageable with the printed circuit board cage. The shaft is coupled to the pivoting portion. The swell nut is coupled to the shaft and engageable with the printed circuit board cage.

BRIEF DESCRIPTION OF THE DRAWINGS

The invention may be understood by reference to the following description taken in conjunction with the accompanying drawings, in which like reference numerals identify like elements, and in which.

Figure 1:
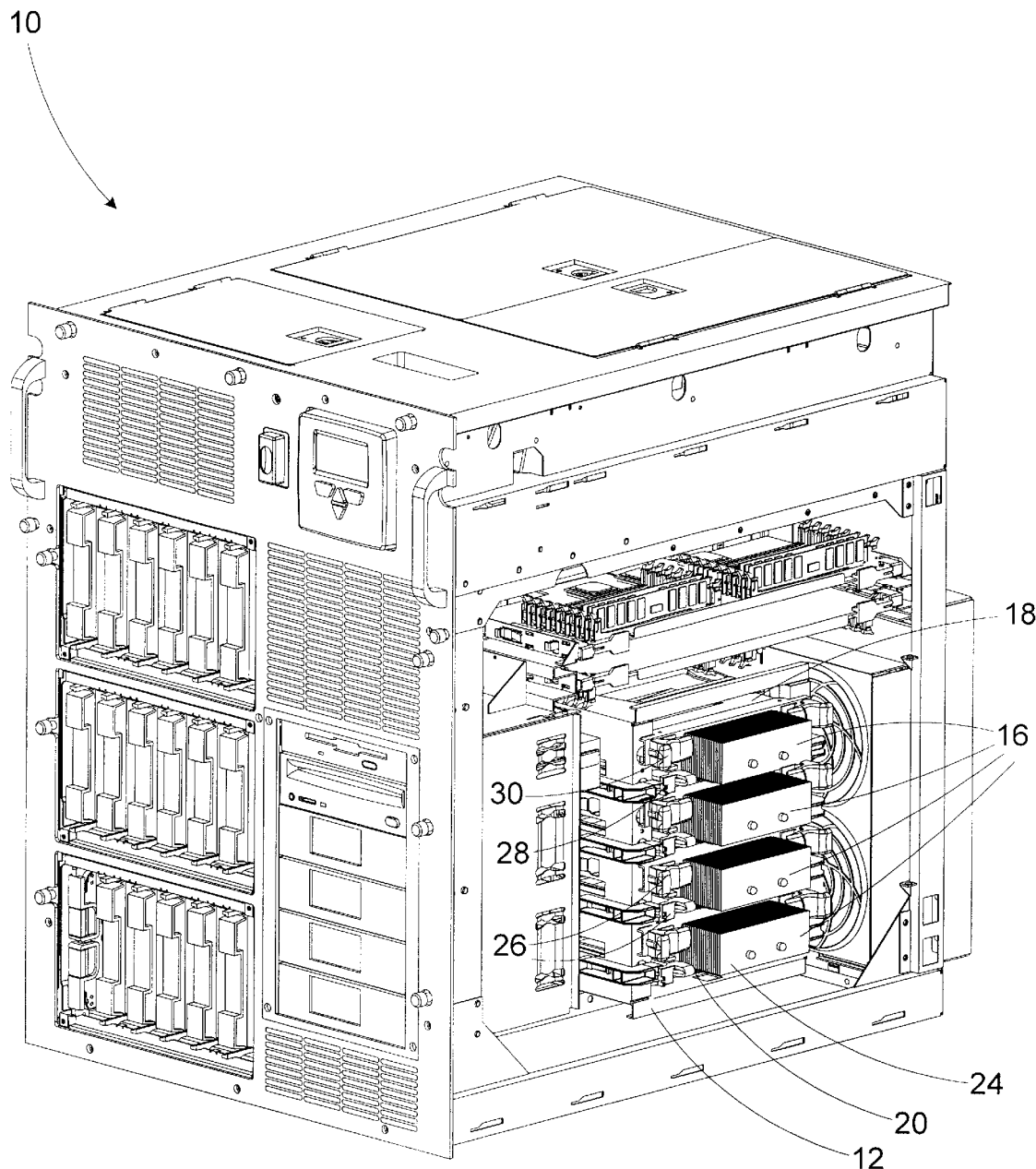
FIG. 1 illustrates a perspective of a personal computer, such as a server.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular, to FIG. 1, a perspective view of a personal computer, such as a server 10 is shown. The server 10 has a side access panel (not shown) removed, exposing a microprocessor cage 12 mounted to a motherboard (not shown). The microprocessor cage 12 houses a plurality of printed circuit boards 16. In the embodiment of the server 10 illustrated in FIG. 1, the printed circuit boards 16 are of two general types, a microprocessor printed circuit board assembly 18 and a voltage regulator module 20. As its name suggests, the microprocessor printed circuit board assembly 18 contains a microprocessor (not shown), such as an Intel Pentium II ®, its associated circuitry (not shown), and a heat pipe 24. The voltage regulator module 20 is positioned adjacent the microprocessor printed circuit board assembly 18, generally providing the function of controlling voltages delivered to the microprocessor board assembly 18. In the embodiment of the server 10 illustrated in FIG. 1, four microprocessor printed circuit board assemblies 18 and four voltage regulator modules 20 are included within the microprocessor cage 12. Although the illustrated embodiment includes four microprocessor printed circuit board assemblies 18 and four voltage regulator modules 20, the invention is applicable to any number of microprocessor printed circuit board assemblies 18 and voltage regulator modules 20.

The microprocessor cage 12 is mounted to the motherboard (not shown), which is vertically mounted within the server 10. The cage 12, the microprocessor printed circuit board assemblies 18, and the voltage regulator modules 20 are relatively heavy, and, accordingly, are mounted to a support member (not shown) connected to a frame or chassis (not shown) of the server 10, rather than only to the motherboard (not shown).

Likewise, the microprocessor printed circuit board assemblies 18 and the voltage regulator modules 20 are also relatively heavy individually. Thus, latching mechanisms 26 are included for both locating the printed circuit boards 16 within their matching electrical connector (not shown), and helping to maintain the printed circuit boards 16 securely seated within their electrical connectors (not shown) during normal operation and shipping. A first type of latching mechanism 28 is associated with the voltage regulator modules 20, and a second type of latching mechanism 30 is associated with the microprocessor printed circuit board assemblies 18. The latching mechanism 30 associated with the microprocessor printed circuit board assemblies 18 is discussed in more detail throughout this specification. The latching mechanism 28 associated with the voltage regulator modules 20 is discussed in detail in co-pending application Ser. No. 09/099,592, filed contemporaneously with the current application, and subject to assignment to a common assignee.

Figure 2:
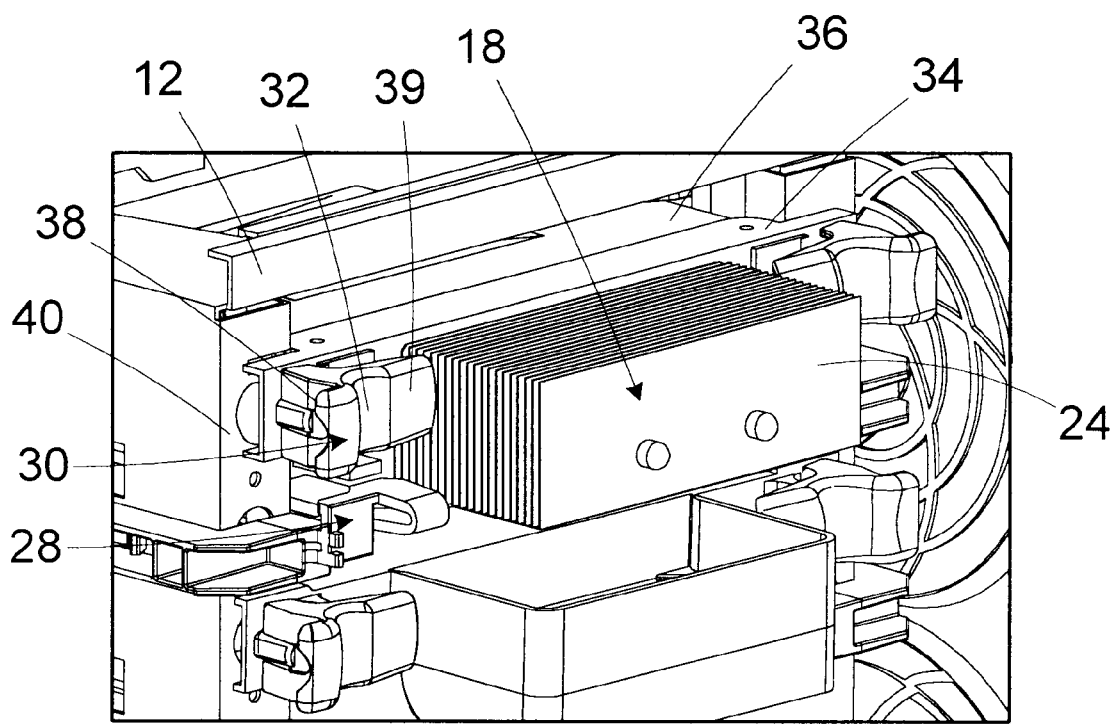
FIG. 2 illustrates a perspective view of a portion of a microprocessor cage and latching mechanism within the server of FIG. 1.

Referring now to FIG. 2, a perspective view of the microprocessor cage 12 with the latching mechanism 30 of the microprocessor printed circuit board assembly 18 installed therein is shown. The microprocessor printed circuit board assembly 18 includes a baseplate 34 and a microprocessor housing 36. The latching mechanism 30 includes a pivoting portion 32 rotatably attached to the baseplate 34. The baseplate 34 is coupled to the microprocessor housing 36, which contains the microprocessor (not shown).

Figure 3:
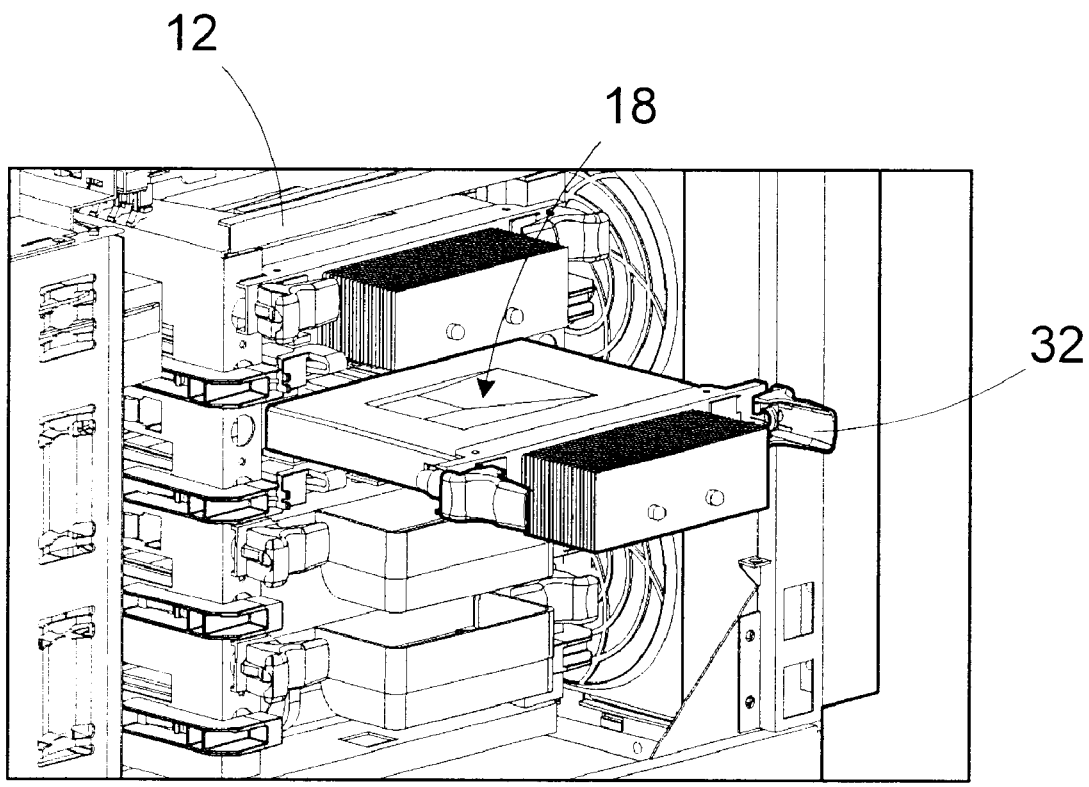
FIG. 3 illustrates an exploded perspective view of a portion of the microprocessor cage and latching mechanism within the server of FIG. 1.

Generally, the pivoting portion 32 is pivotable to a first position (as shown in FIG. 2) in which it engages the microprocessor cage 12 to removably couple the microprocessor printed circuit board assembly 18 into its edge connector (not shown) and into the microprocessor cage 12. An ejector 38 defined in the pivoting portion 32 is also used to assist in removing the microprocessor printed circuit board assembly 18 from its edge connector (not shown) and the microprocessor cage 12. A finger tab 39 is defined in the pivoting portion 32 to facilitate pivoting of the pivoting portion 32. As described in greater detail below the pivoting portion 32 rotates about three different axes of rotation depending on the position and direction of rotation of the pivoting portion 32. Rotating the pivoting portion 32 in one direction causes the ejector 38 to engage a top surface 40 of the microprocessor cage 12 and apply an outward force, urging the microprocessor printed circuit board assembly 18 to decouple from its edge connector (not shown) and slide out from microprocessor cage 12 along a track (not shown) formed in the side of the microprocessor cage 12. FIG. 3 illustrates the microprocessor printed circuit board assembly 18 being removed from the microprocessor cage 12, and the pivoting portions 32 in the unlatched position.

Figure 4:
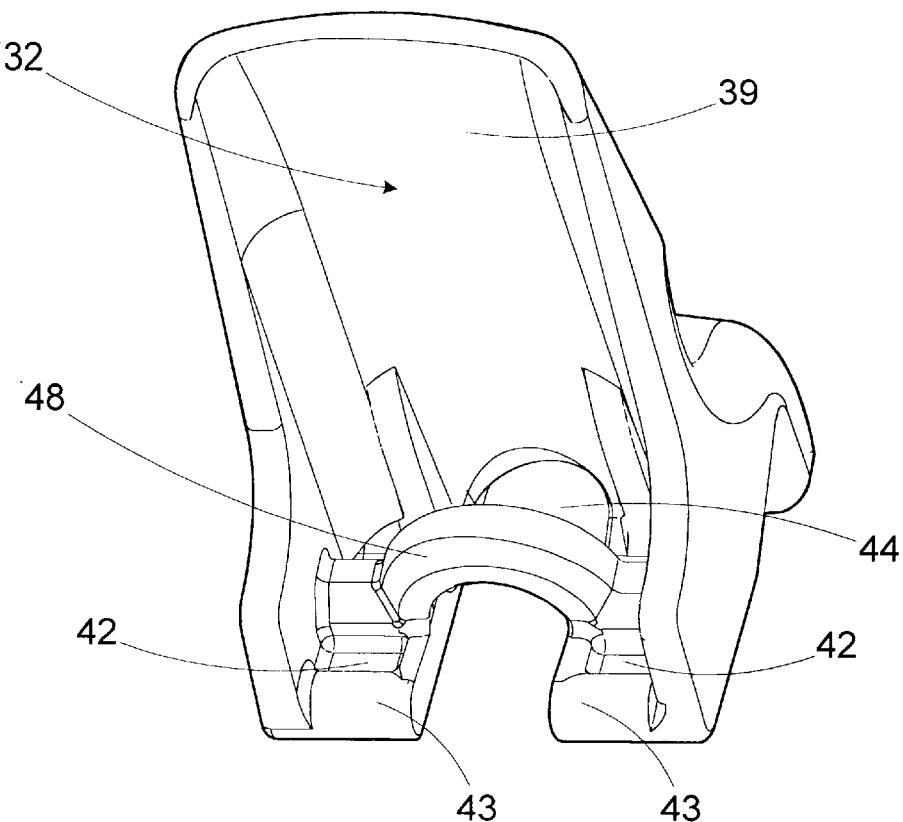
FIG. 4 illustrates a perspective view of a pivoting portion of the latching mechanism of FIG. 3.
Figure 5:
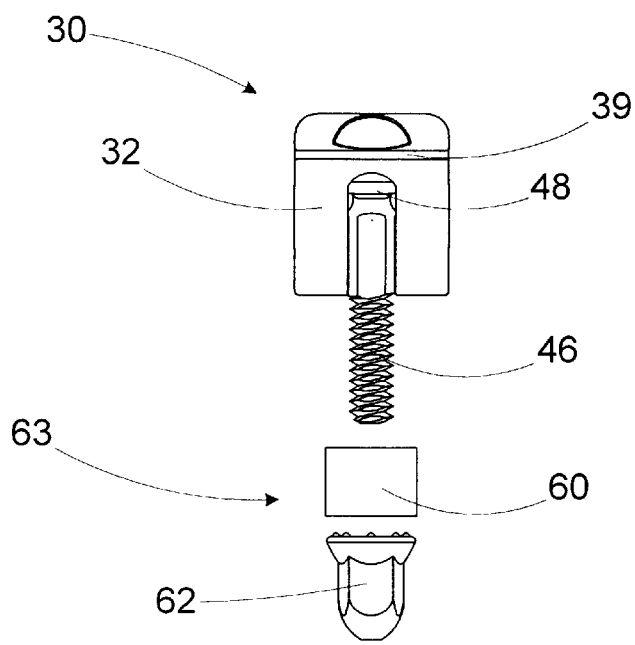
FIG. 5 illustrates an end view of portions of the latching mechanism of FIG. 3.

Referring now to FIGS. 4 and 5, end views of the latching mechanism 30 are shown. FIG. 4 illustrates an isometric end view of the pivoting portion 32, and FIG. 5 illustrates a two dimensional end view of a portion of the latching mechanism 30 with the finger tab 39 extending into the page. Referring to FIG. 4, a pair of recesses 42 are defined in an inner surface 43 of the pivoting portion 32. A slot 44 is defined through a portion of the pivoting portion 32 to facilitate insertion of a T-shaft 46 (seen in FIG. 5) through the pivoting portion 32. An arched retainer 48 is also defined in the pivoting portion 32 to retain the T-shaft 46 when inserted through the slot 44. As seen in FIG. 5, a compressible bushing 60 is retained on the T-shaft 46 by an acorn nut 62. Collectively, the compressible bushing 60 and acorn nut 62 define a swell nut 63.

Figure 6:
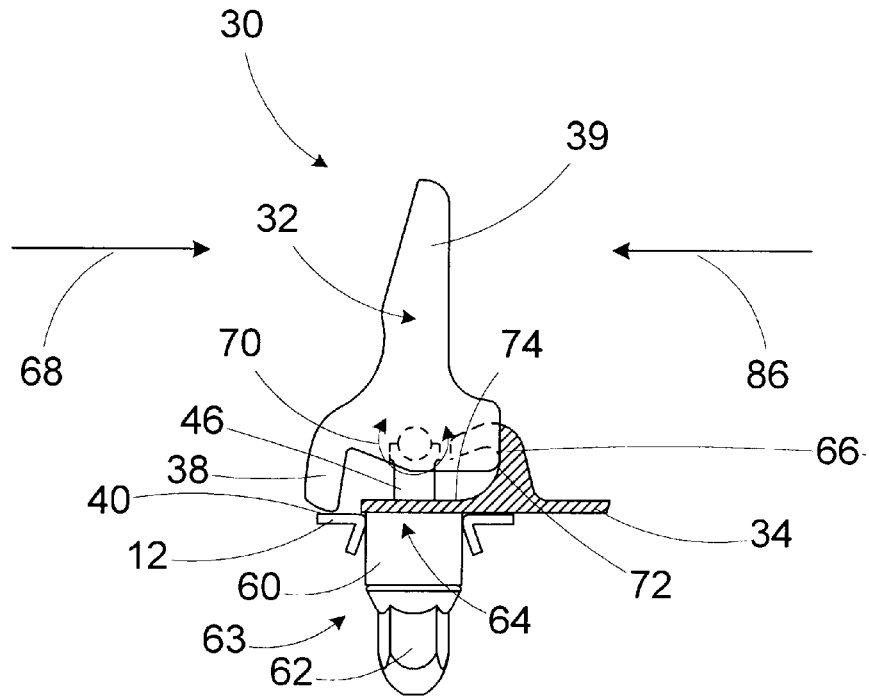
FIG. 6 illustrates a partial cross-sectional view of the latching mechanism of FIG. 3 in an unlatched position.
Figure 7:
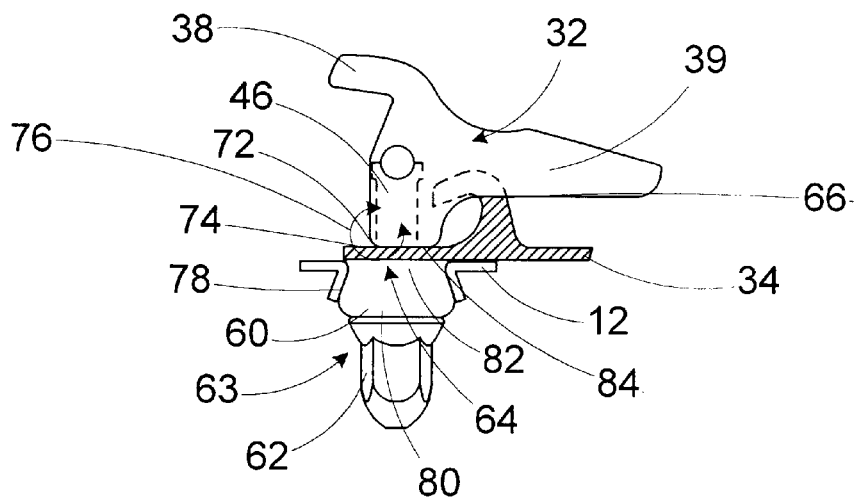
FIG. 7 illustrates a partial cross-sectional view of the latching mechanism of FIG. 3 in a latched position.
Figure 8:
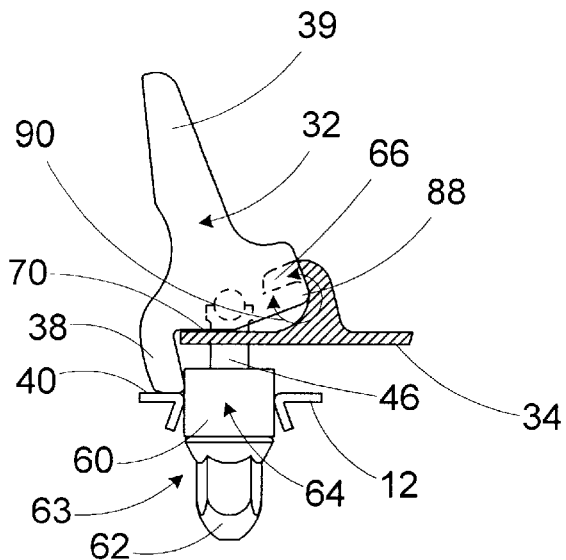
FIG. 8 illustrates a partial cross-sectional view of the latching mechanism of FIG. 3 in an ejected position.
Figure 9:
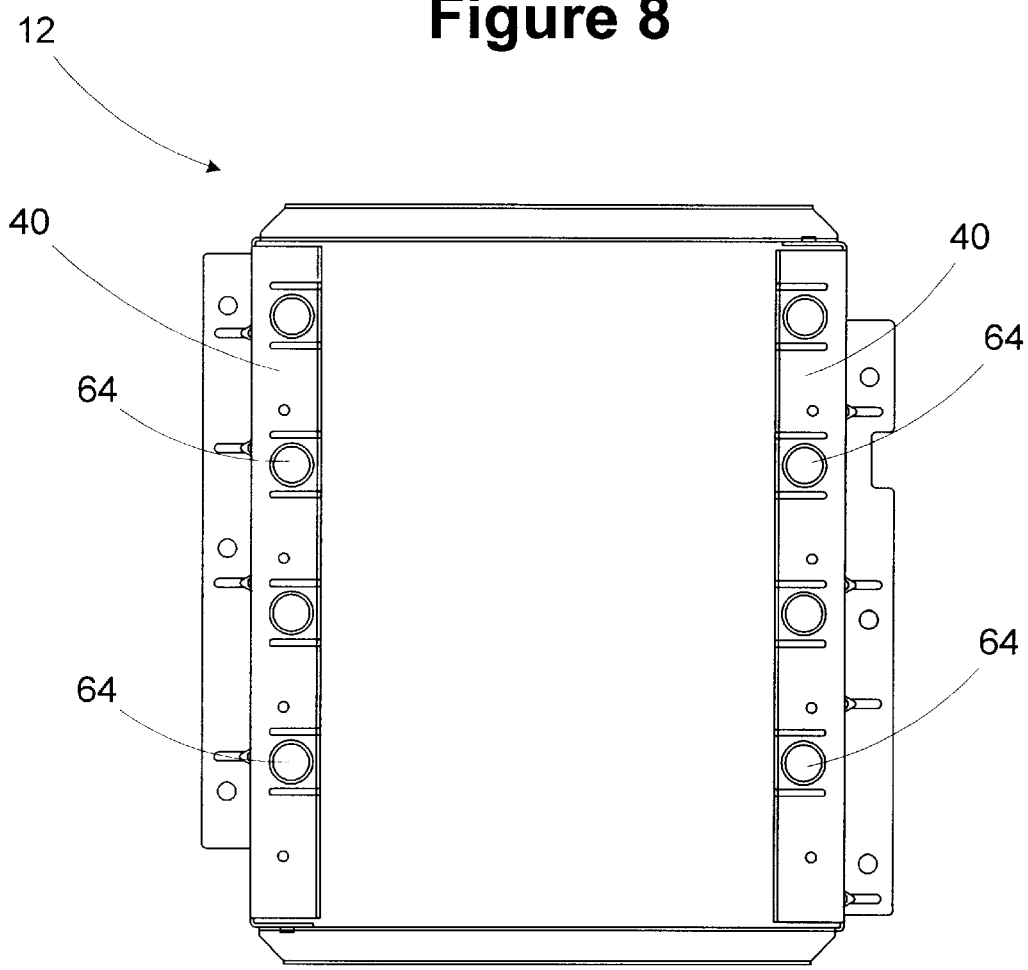
FIG. 9 illustrates a top view of the microprocessor cage of FIG. 2.

Referring now to FIGS. 6 through 8, partial side cross sections of the latching mechanism 30 in different positions are shown. FIG. 6 illustrates the latching mechanism 30 in an unlatched position, FIG. 7 illustrates the latching mechanism 30 in a latched position, and FIG. 8 illustrates the latching mechanism 30 in an ejected position. Referring briefly to FIG. 9, a top view of the microprocessor cage 12 is provided. A plurality of holes 64 are defined in the top surface 40 of the microprocessor cage 12. As the microprocessor printed circuit board assembly 18 is inserted into the microprocessor cage 12, the swell nut 63 is received within a corresponding hole 64 in the microprocessor cage 12. The microprocessor printed circuit board assembly 18 is manually inserted until its edge connector (not shown) is seated in the corresponding connector (not shown) on the motherboard (not shown).

Returning to FIG. 6, two hooks 66 are defined in the baseplate 34. The hooks 66 are proximate the recesses 42 defined in the inner surface 43 of the pivoting portion 32.

The hooks 66 may or may not be contacting the inner surface 43 while the latching mechanism 30 is in the unlatched position of FIG. 6. To latch the latching mechanism 30 and thus retain the microprocessor printed circuit board assembly 18 within the microprocessor cage 12, force is applied to the finger tab 39 in the direction indicated by the arrow 68 shown in FIG. 6.

As force is applied in the direction indicated by the arrow 68, the pivoting portion 32 rotates about the head of the T-shaft 46, thus defining a first axis of rotation 70 for the pivoting portion 32. Eventually, a cam surface 72 of the pivoting portion 32 engages an upper surface 74 of the base plate 34. The pivoting portion 32 then rotates about the cam surface 70, thus defining a second axis of rotation 76 for the pivoting portion 32. Rotation about the cam surface 72 causes the T-shaft 46 to be pulled upward, thus compressing the compressible bushing 60 between the baseplate 34 and the acorn nut 62.

The expanding compressible bushing 60 contacts a flanged surface 78 of the microprocessor cage 12. The flanged surface 78 causes the compressible bushing 60 to expand such that the lower end 80 of the compressible bushing 60 is larger than the upper end 82 of the compressible bushing 60, thus retaining the swell nut 63 within the hole 64. As the rotation about the cam surface 72 is completed, an end surface 84 of the pivoting portion 32 contacts the upper surface 74 of the baseplate 34, thus inhibiting any further rotation or reverse rotation about the cam surface 72. The resulting latched position of the pivoting portion 32 is shown in FIG. 7.

The compressible bushing 60 serves two purposes. First, as described above, the compressible bushing 60 secures the microprocessor printed circuit board assembly 18 into the microprocessor cage 12. Second, the compression of the compressible bushing 60 provides a pre-loaded condition to inhibit displacement of the microprocessor printed circuit board assembly 18 due to any jarring force tending to disengage or misalign the edge connector (not shown) of the microprocessor printed circuit board assembly 18 with the corresponding connector (not shown) on the motherboard (not shown). Any displacing force must first overcome the pre-loading force provided by the compressible bushing 60. Also, any displacement of the microprocessor printed circuit board assembly 18 with respect to the microprocessor cage 12 will cause further compression of the compressible bushing 60, thus increasing the inhibiting force provided. This increased compressive force may be sufficient to reseat the microprocessor printed circuit board assembly 18 when the jarring force is removed.

Referring back to FIG. 6, to assist in removing the microprocessor printed circuit board assembly 18 from the microprocessor cage 12, the pivoting portion 32 is rotated by a force applied to the finger tab 39 in the direction indicated by the arrow 86. Although, FIG. 6 shows the ejector 38 contacting the top surface 40 of the microprocessor cage 12 in the unlatched position, it may not actually be in contact therewith. In response to the force applied to the finger tab 39 in the direction of the arrow 86, the pivoting portion 32 rotates about the T-shaft 46 (i.e., the first axis of rotation 70) until the ejector 38 contacts the upper surface 40. Subsequent rotation causes the end 88 of the pivoting portion 32 proximate the hooks 66 to lift, thus engaging the hooks 66 with the inner surface 43 of the pivoting portion 32. The recesses 42 (as seen in FIG. 4) provide clearance for the hooks 66 during the rotation. Engagement of the hooks 66 with the inner surface 43 prevents further upward movement of the end 88 and causes the pivoting portion 32 to rotate about a third axis of rotation 90.

Because the hooks 66 prevent further upward movement of the end 88 of the pivoting portion 32, the force applied about the third axis of rotation 90 is transferred to ejector 38, thus urging the microprocessor printed circuit board assembly 18 to disengage. FIG. 8 illustrates the pivoting portion 32 facilitating such disengagement and the withdrawal of the swell nut 63 from the hole 64 in the microprocessor cage 12.

The forces holding a typical microprocessor printed circuit board assembly 18 in the motherboard connector (not shown) may be as high as 40 pounds or more. If the microprocessor printed circuit board assembly 18 were to be manually pulled to disengage it from the motherboard connector (not shown), the force applied, especially if repeated often, could displace the server 10, or cause damage to one or more of the server components. The manner in which the pivoting portion 32 transfers the force applied to the finger tab 39 to a disengagement force applied at the 38 obviates the need to apply a high force to disengage the microprocessor printed circuit board assembly 18, thus providing a more robust, easier to maintain server 10.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus coupling a printed circuit board within a printed circuit board cage, comprising:

a baseplate mounted to the printed circuit board; and a latch rotably coupled to the baseplate, the latch including:

a pivoting portion, the pivoting portion including an ejector extending from an end of the pivoting portion and being engageable with the printed circuit board cage;

a shaft coupled to the pivoting portion; and a swell nut coupled to the shaft and engageable with the printed circuit board cage.

2. The apparatus of claim 1, wherein the shaft comprises a T-shaft, the pivoting portion includes a slot defined therein, and the T-shaft extends through at least a portion of the slot.

3. The apparatus of claim 2, wherein the pivoting portion includes a retainer adapted to retain the T-shaft within the slot.

4. The apparatus of claim 3, wherein the retainer comprises an arched retainer.

5. The apparatus of claim 2, wherein the T-shaft includes a shank and a head, the head having an axis, and a first axis of rotation of the pivoting portion is defined about the axis of the head.

6. The apparatus of claim 5, wherein the pivoting member is rotatable about the first axis of rotation in an unlatched position of the pivoting member.

7. The apparatus of claim 1, wherein the pivoting portion includes a cam surface proximate the baseplate.

8. The apparatus of claim 5, wherein the pivoting portion includes a cam surface proximate the baseplate, and a second axis of rotation is defined about the cam surface.

9. The apparatus of claim 8, wherein the pivoting member is rotatable about the second axis of rotation while transitioning from an unlatched position of the pivoting member to a latched position of the pivoting member.

10. The apparatus of claim 8, wherein a third axis of rotation is defined about the ejector.

11. The apparatus of claim 10, wherein the ejector is engageable with the printed circuit board cage and the pivotable member is rotatable about the third axis of rotation while transitioning from an unlatched position to an ejected position.

12. The apparatus of claim 7, wherein the printed circuit board cage includes a hole defined therein, at least a portion of the swell nut extends through the hole, and the swell nut is engageable with the hole.

13. A mounting system, comprising:

a chassis;

a motherboard mounted to the chassis;

a printed circuit board cage mounted to the chassis proximate the motherboard;

a printed circuit board engageable with the motherboard;

a baseplate mounted to the printed circuit board; and a latch rotably coupled to the baseplate, the latch including:

a pivoting portion, the pivoting portion including an ejector extending from an end of the pivoting portion and being engageable with the printed circuit board cage;

a shaft coupled to the pivoting portion; and a swell nut coupled to the shaft and engageable with the printed circuit board cage.

14. The apparatus of claim 13, wherein the shaft comprises a T-shaft, the pivoting portion includes a slot defined therein, and the T-shaft extends through at least a portion of the slot.

15. The apparatus of claim 14, wherein the pivoting portion includes a retainer adapted to retain the T-shaft within the slot.

16. The apparatus of claim 15, wherein the retainer comprises an arched retainer.

17. The apparatus of claim 14, wherein the T-shaft includes a shank and a head, the head having an axis, and a first axis of rotation of the pivoting portion is defined about the axis of the head.

18. The apparatus of claim 17, wherein the pivoting member is rotatable about the first axis of rotation in an unlatched position of the pivoting member.

19. The apparatus of claim 13, wherein the pivoting portion includes a cam surface proximate the baseplate.

20. The apparatus of claim 17, wherein the pivoting portion includes a cam surface proximate the baseplate, and a second axis of rotation is defined about the cam surface.

21. The apparatus of claim 20, wherein the pivoting member is rotatable about the second axis of rotation while transitioning from an unlatched position of the pivoting member to a latched position of the pivoting member.

22. The apparatus of claim 20, wherein a third axis of rotation is defined about the ejector.

23. The apparatus of claim 22, wherein the ejector is engageable with the printed circuit board cage and the pivotable member is rotatable about the third axis of rotation while transitioning from an unlatched position to an ejected position.

24. The apparatus of claim 19, wherein the printed circuit board cage includes a hole defined therein, at least a portion of the swell nut extends through the hole, and the swell nut is engageable with the hole.

* * * * *